US011688835B2

(12) United States Patent
Kim et al.

(10) Patent No.: US 11,688,835 B2
(45) Date of Patent: Jun. 27, 2023

(54) FLASH LED PACKAGE

(71) Applicant: SAMSUNG ELECTRONICS CO., LTD., Suwon-si (KR)

(72) Inventors: Kyoungjun Kim, Yongin-si (KR); Jaeyoo Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 81 days.

(21) Appl. No.: 17/142,435

(22) Filed: Jan. 6, 2021

(65) Prior Publication Data
US 2021/0376200 A1  Dec. 2, 2021

(30) Foreign Application Priority Data
Jun. 1, 2020 (KR) ........................ 10-2020-0065981

(51) Int. Cl.
| | |
|---|---|
| *H01L 33/50* | (2010.01) |
| *H01L 33/60* | (2010.01) |
| *H01L 33/62* | (2010.01) |
| *H01L 27/15* | (2006.01) |
| *H05B 45/28* | (2020.01) |

(52) U.S. Cl.
CPC .......... *H01L 33/504* (2013.01); *H01L 27/156* (2013.01); *H01L 33/60* (2013.01); *H01L 33/62* (2013.01); *H05B 45/28* (2020.01)

(58) Field of Classification Search
None
See application file for complete search history.

(56) References Cited

U.S. PATENT DOCUMENTS

| | | | |
|---|---|---|---|
| 7,539,407 B2 * | 5/2009 | Maeda ................... | G03B 15/05 362/373 |
| 7,683,981 B2 | 3/2010 | Uemoto | |
| 10,172,206 B2 | 1/2019 | Yan et al. | |
| 2003/0218689 A1 * | 11/2003 | Angeli ................. | H04N 5/2256 348/370 |
| 2010/0124041 A1 * | 5/2010 | Druchinin ........... | H04N 5/2256 362/16 |
| 2010/0171120 A1 * | 7/2010 | Gosain ................. | G06F 3/0421 438/34 |
| 2011/0084292 A1 * | 4/2011 | McDaniel, Jr. ........... | F21K 9/00 716/132 |
| 2017/0215251 A1 | 7/2017 | Lai | |
| 2019/0195456 A1 * | 6/2019 | Pfeffer .................... | H01L 33/58 |
| 2019/0297701 A1 * | 9/2019 | Cao ........................ | H05B 45/20 |

(Continued)

FOREIGN PATENT DOCUMENTS

| | | |
|---|---|---|
| EP | 2161494 B1 | 11/2011 |
| EP | 2792940 B1 | 9/2016 |

(Continued)

*Primary Examiner* — Robert K Carpenter
(74) *Attorney, Agent, or Firm* — Lee IP Law, P.C.

(57) ABSTRACT

A flash LED package includes a substrate; a flash LED device in a first region of an upper surface of the substrate, and including first to fourth LED light sources that emit white light, blue light, green light, and red light, respectively; an optical sensor in a second region of the upper surface of the substrate, and having a light receiving region that detects a correlated color temperature; and a lens cover on the substrate to cover the flash LED device and the optical sensor, and having a lens unit in a region overlapping the first to fourth LED light sources.

16 Claims, 12 Drawing Sheets

(56) References Cited

U.S. PATENT DOCUMENTS

2019/0302573 A1* 10/2019 Choi .................... H01L 33/505
2019/0325191 A1   10/2019 Weaver et al.
2019/0363230 A1* 11/2019 Kim ..................... H01L 33/60

FOREIGN PATENT DOCUMENTS

| JP | 2006-135006 A | 5/2006 |
|---|---|---|
| KR | 10-0999036 B1 | 12/2010 |
| KR | 10-2017-0101065 A | 9/2017 |

* cited by examiner

FLASH LED PACKAGE

CROSS-REFERENCE TO RELATED APPLICATION

Korean Patent Application No. 10-2020-0065981, filed on Jun. 1, 2020, in the Korean Intellectual Property Office, and entitled: "Flash LED Package," is incorporated by reference herein in its entirety.

BACKGROUND

1. Field

Embodiments relate to a flash light emitting diode (LED) package.

2. Description of the Related Art

Recently, as a camera function has been emphasized in a mobile device such as a mobile phone, a flash LED package providing flash light for imaging a subject has been adopted.

SUMMARY

Embodiments are directed to a flash LED package, including: a substrate; a flash LED device in a first region of an upper surface of the substrate, and including first to fourth LED light sources that emit white light, blue light, green light, and red light, respectively; an optical sensor in a second region of the upper surface of the substrate, and having a light receiving region that detects a correlated color temperature; and a lens cover on the substrate to cover the flash LED device and the optical sensor, and having a lens unit in a region overlapping the first to fourth LED light sources.

Embodiments are also directed to a flash LED package, including a substrate; a flash LED device on an upper surface of the substrate, the flash LED device including first to fourth LED light sources that emit white light, blue light, green light, and red light, respectively, and having side surfaces surrounded by a reflective structure; and a lens cover on the substrate, the lens cover having an upper surface having a lens unit in a region overlapping the first to fourth LED light sources, and having a lower surface facing the flash LED device.

Embodiments are also directed to a flash LED package, including: a substrate; a flash LED device in a first region of an upper surface of the substrate, and including first to fourth LED light sources that emit white light, blue light, green light, and red light, respectively; an optical sensor in a second region of the upper surface of the substrate, and having a light receiving region that detects a correlated color temperature of incident light; a lens cover on the substrate to cover the flash LED device and the optical sensor, and having a lens unit in a region overlapping the first to fourth LED light sources; and a control unit that applies a driving power value corresponding to a value of the correlated color temperature detected by the optical sensor to the first to fourth LED light sources with reference to a previously-stored look-up table to control the correlated color temperature of light emitted from the flash LED device.

BRIEF DESCRIPTION OF DRAWINGS

Features will become apparent to those of skill in the art by describing in detail example embodiments with reference to the attached drawings in which.

DETAILED DESCRIPTION

Figure 1:
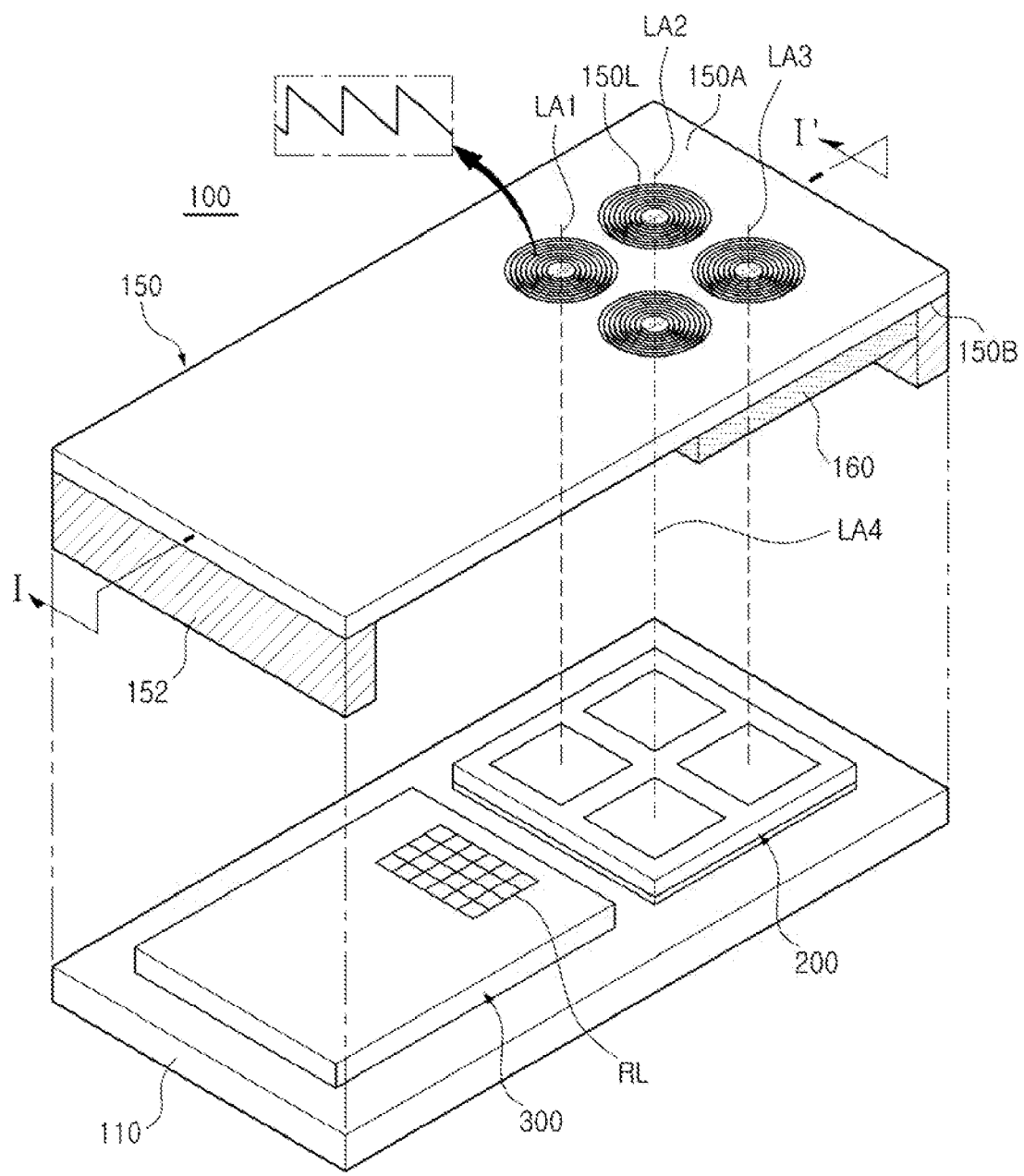
FIG. 1 is an exploded perspective view illustrating a flash LED package according to an example embodiment.
Figure 2:
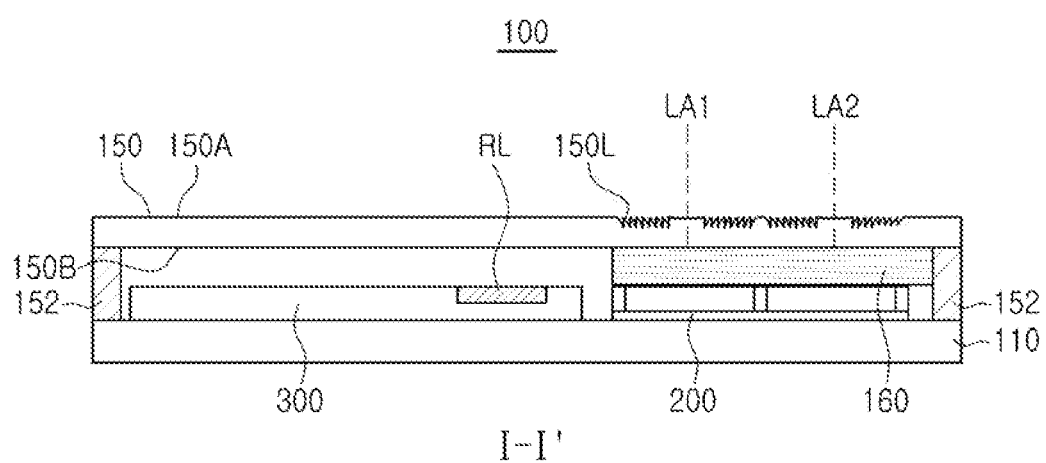
FIG. 2 is a side cross-sectional view taken along line I-I' of the flash LED package (an assembled state) shown in FIG. 1.

FIG. 1 is an exploded perspective view illustrating a flash light emitting diode (LED) package according to an example embodiment, and FIG. 2 is a side cross-sectional view taken along line I-I' of the flash LED package (an assembled state) shown in FIG. 1.

Referring to FIGS. 1 and 2, a flash LED package 100 according to the present example embodiment includes a substrate 110, a flash LED device 200 having light sources disposed adjacent to each other on an upper surface of the substrate 110, and a lens cover 150 disposed on the substrate 110 to cover the flash LED device 200 and the optical sensor 300.

The substrate 110 may be, for example, a substrate such as a printed circuit board (PCB), a metal core PCB (MCPCB), a metal PCB (MPCB), a flexible PCB (FPCB), or the like. The flash LED device 200 and the optical sensor 300 may be electrically connected to a circuit of the substrate 110. In an example embodiment, an additional device such as a Zener diode may be mounted on the substrate 110.

Figure 3A:
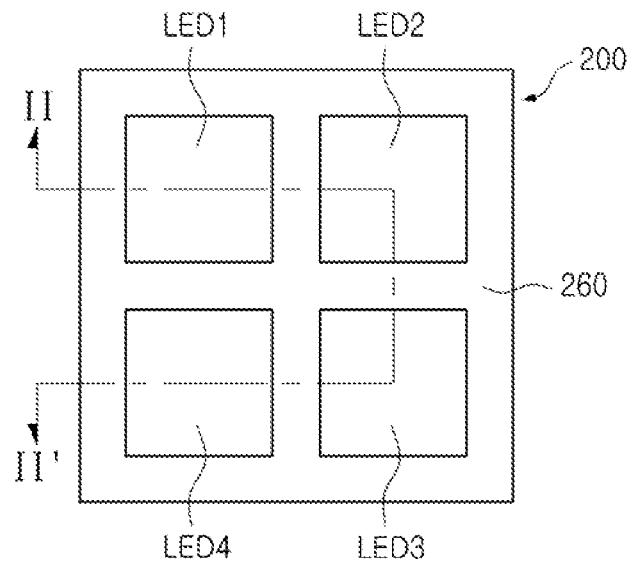
FIG. 3A is a plan view of the flash LED device shown in FIG. 1.
Figure 3B:
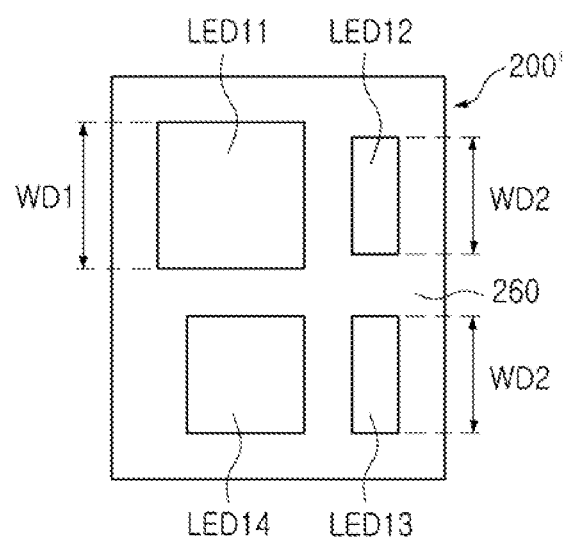
FIG. 3B is a plan view of a flash LED device according to an example embodiment.

FIG. 3A is a plan view of the flash LED device shown in FIG. 1. FIG. 3B is a plan view of a flash LED device according to an example embodiment.

Referring to FIG. 3A, the flash LED device 200 may include first to fourth LED light sources LED1 to LED4 that emit light of different wavelength bands. The first to fourth LED light sources LED1 to LED4 may operate in combination to emit light of various colors and various color temperatures according to the amount of light emitted from each of the first to fourth light sources LED1 to LED4.

When viewed from above, for example, as viewed in FIG. 3A, the first to fourth LED light sources LED1 to LED4 may be arranged in rows and columns. In the present example embodiment, a shape in which the first to fourth LED light sources LED1 to LED4 is illustrated in a 2*2 matrix arrangement, but the first through fourth LED light sources LED1 to LED4 may be arranged in, for example, rows and columns as a 1*4 matrix arranged in various ways.

The first to fourth LED light sources LED1 to LED4 may emit white light, blue light, green light, and red light, respectively.

The first LED light source LED1 may have a color temperature of 2000K to 5500K and may emit white light having a color rendering index of 80 or higher.

In the present example embodiment, a case in which the four LED light sources emit white light, blue light, green light, and red light, respectively, is illustrated. In another example embodiment, light sources may be configured such that five or more LED light sources are provided, and a plurality of LED light sources emit light of the same color. In an example embodiment, five LED light sources may be provided, and two LED light sources that emit red light may be included.

As illustrated in FIG. 3A, in an example embodiment, when viewed from above, the first to fourth LED light sources LED1 to LED4 may have the same area as each other.

In another example embodiment, as illustrated in FIG. 3B, a first LED light source LED11 that emits white light may have a square shape having a largest length WD1 on one side, for example, larger than other light sources adjacent thereto. A fourth LED light source LED14 that emits red light may have a square shape in which a length of one side WD2 is smaller than the length of one side WD1 of the first LED light source LED11. Second and third light sources LED12 and LED13 that emit blue light or green light may have a rectangular shape in which a length of a long side thereof is the same as the fourth LED light source LED14.

Referring again to FIG. 3A, each of the side surfaces of the first to fourth LED light sources LED1 to LED4 may be surrounded by a reflective structure 260 having a partition wall structure. The first to fourth LED light sources LED1 to LED4 may be devices that emit light having different colors and color temperatures by combining an LED chip and a wavelength conversion element, respectively, and a detailed description thereof will be described later with reference to FIGS. 4, 5A, and 5B. In the present example embodiment, the reflective structure 260 may separate the first to fourth LED light sources LED1 to LED4 of the flash LED device 200 from each other to prevent occurrence of an optical cross talk phenomenon in which light emitted from each of the first to fourth LED light sources LED1 to LED4 is mixed before being emitted to the front of the flash LED device 200. The reflective structure 260 may include a resin body containing reflective powder. In an example embodiment, the resin body may include a silicone resin or epoxy resin. The reflective powder may be white ceramic powder or metal powder. In an example embodiment, the ceramic powder may be one or more of $TiO_2$, $Al_2O_3$, $Nb_2O_5$, or ZnO. The metal powder may be a material such as Al or Ag.

Referring again to FIGS. 1 and 2, the optical sensor 300 has a light receiving region RL for receiving ambient light, and may be disposed adjacent to the flash LED device 200. The light receiving region RL may include a photodiode array. In the present example embodiment, the optical sensor 300 may be an ambient light sensor ALS that detects light in a surrounding environment and detects a value of a correlated color temperature CCT in the surrounding environment. In an example embodiment, when a camera coupled to the flash LED package 100 is operated, the optical sensor 300 may monitor ambient light, and the flash LED device 200 may emit light having an amount of light corresponding to a CCT value detected on a subject with reference to a pre-stored look-up table. In an example embodiment, the optical sensor 300 may be integrally disposed in one body unit with a control unit, described below.

The lens cover 150 may cover the flash LED device 200 and the optical sensor 300, and may have a lens unit 150L in a region overlapping the flash LED device 200. The lens unit 150L may be disposed to have a lens or lenses with optical axes LA1 to LA4 respectively passing through a center of the first to fourth LED light sources LED1 to LED4, to correspond to the first to fourth LED light sources LED1 to LED4 of the flash LED device 200, respectively. In another example embodiment, the shape of the lens unit 150L may be varied to have a size corresponding to two or more LED light sources among the first to fourth LED light sources LED1 to LED4.

In the present example embodiment, the lens cover 150 has a substantially plate shape, and may be supported on the substrate 110 by a sidewall structure 152 such as a pillar or a support wall. The structure and shape of the lens cover 150 may be variously changed.

The lens unit 150L may have a lens shape that is formed on an upper surface 150A of the lens cover 150. A lower surface region 150B of the lens unit 150L may be provided as a light incident region into which light emitted from a diffusion sheet 160 (disposed between the lens cover 150 and the flash LED device 200) is incident. The diffusion sheet 160 may diffuse light so that light emitted from the first to fourth light sources LED1 to LED4 of the flash LED device 200 is uniformly mixed.

The lens unit 150L may operate as an optical element that uniformly disperses the light of the flash LED device 200 incident from the diffusion sheet 160 at a wide angle. In an example embodiment, the lens unit 150L may be a Fresnel lens. In an example embodiment, a field-of-view (FOV) of the lens unit 150L may be 100° or more, for example, about 120° or more. An area of the lens unit 150L may have an area that is sufficiently large to cover the first to fourth LED light sources LED1 to LED4 of the flash LED device 200.

Figure 4:
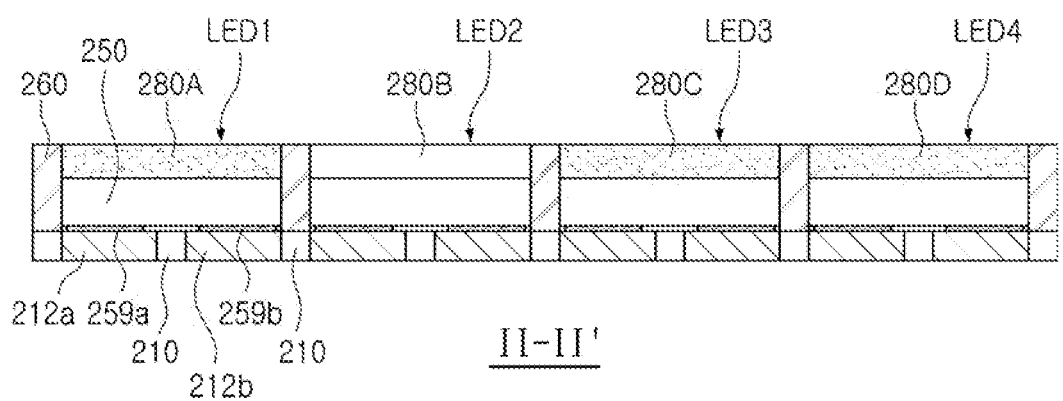
FIG. 4 is a side cross-sectional view taken along line II-II' of the flash LED device of FIG. 3A.
Figure 5A:
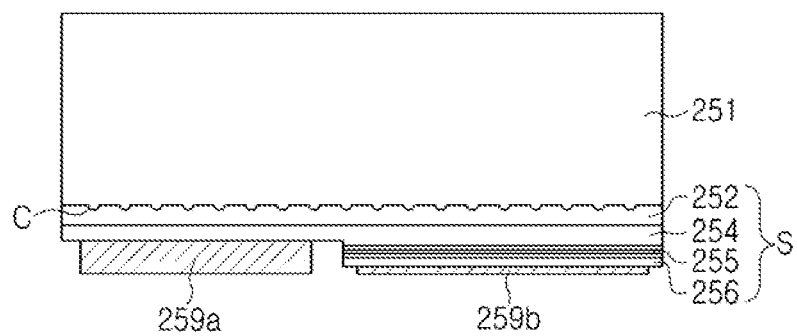
FIGS. 5A and 5B are cross-sectional views illustrating various LED chips according to example embodiments.
Figure 5B:
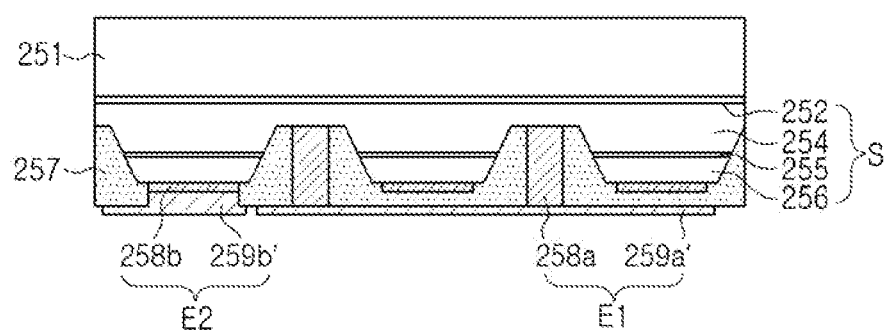

FIG. 4 is a side cross-sectional view taken along line II-II' of the flash LED device of FIG. 3A, and FIGS. 5A and 5B are cross-sectional views illustrating various LED chips for the flash LED device, according to example embodiments.

Referring to FIGS. 3A and 4, the flash LED device 200 according to the present example embodiment may include a wiring board 210 and the first to fourth LED light sources LED1 to LED4 disposed on the wiring board 210.

Each of the first to fourth LED light sources LED1 to LED4 may include one LED chip 250 and first to fourth wavelength conversion films 280A to 280D disposed to respectively cover each of the LED chips 250. The first to fourth wavelength converting films 280A to 280D may include at least one type of wavelength conversion material converting a portion of light emitted from the LED chip 250 into light having a first wavelength different from the emitted wavelength of the LED chip 250. Each of the first to fourth wavelength converting films 280A to 280D may include a resin layer or a ceramic phosphor film in which a wavelength conversion material is dispersed. In an example embodiment, the wavelength conversion material may be at least one of a phosphor and a quantum dot.

The flash LED device 200 may be configured to emit light of various colors and color temperatures by mixing white light, blue light, green light, and red light emitted from the first to fourth LED light sources LED1 to LED4, respectively. The LED chip 250 may emit blue light. In an example embodiment, the LED chip 250 may emit light having a dominant wavelength ranging from 440 nm to 460 nm. The wavelength conversion material included in at least one of, for example, three or four of, the first to fourth wavelength conversion films 280A to 280D may include phosphors or quantum dots converting a portion of blue light from the LED chip 250 into a different wavelength range.

The first wavelength conversion film 280A may include a wavelength conversion material converting blue light from the LED chip 250 into yellow light, or a plurality of wavelength conversion materials converting blue light from the LED chip 250 into red light and green light.

The third wavelength conversion film 280C may include a wavelength conversion material converting blue light from the LED chip 250 into green light.

The fourth wavelength conversion film 280D may include a wavelength conversion material converting blue light from the LED chip 250 into red light.

The second wavelength conversion film 280B may include a wavelength conversion material converting blue light from the LED chip 250 into blue light in a different wavelength range, or may not include a wavelength conversion material.

The LED chip 250 of the present example embodiment may have a flip-chip structure in which a light emitting surface and an electrode forming surface are located opposite to each other, although various types of LED chips may be employed.

FIGS. 5A and 5B are cross-sectional views illustrating various LED chips according to example embodiments.

Referring to FIG. 5A, an LED chip 250A includes a substrate 251, and a semiconductor laminate S having a first conductivity-type semiconductor layer 254, an active layer 255, and a second conductivity-type semiconductor layer 256 sequentially disposed on the substrate 251. A buffer layer 252 may be disposed between the substrate 251 and the first conductivity-type semiconductor layer 254. A first electrode 259a and a second electrode 259b are disposed at a surface of LED chip 250A.

The substrate 251 may be an insulating substrate such as sapphire. In another example embodiment, the substrate 251 may be a conductive substrate or a semiconductor substrate other than an insulating substrate. In an example embodiment, the substrate 251 may be formed of SiC, Si, $MgAl_2O_4$, MgO, $LiAlO_2$, $LiGaO_2$, or GaN, other than sapphire. An unevenness C may be formed on the upper surface of the substrate 251. The unevenness C may improve quality of a single crystal grown while improving light extraction efficiency.

The buffer layer 252 may be, for example, $In_xAl_yGa_{1-x-y}N$ (0≤x≤1, 0≤y≤1). In an example embodiment, the buffer layer 252 may be formed of GaN, AlN, AlGaN, and InGaN. If desired, the buffer layer 252 may formed by combining a plurality of layers, or may include a plurality of layers in which a portion of compositions of the layers are gradually changed.

The first conductivity-type semiconductor layer 254 may be formed of a nitride semiconductor satisfying n-type $In_xAl_yGa_{1-x-y}N$ (0≤x≤1, 0≤y<1, 0≤x+y<1), and the n-type impurity may be Si. In an example embodiment, the first conductivity-type semiconductor layer 254 may include n-type GaN.

The second conductivity-type semiconductor layer 256 may be formed of a nitride semiconductor layer satisfying p-type $In_xAl_yGa_{1-x-y}N$ (0≤x<1, 0≤y<1, 0≤x+y<1), and the p-type impurity may be Mg. In an example embodiment, the second conductivity-type semiconductor layer 256 may have a single layer structure. In another example embodiment, the second conductivity-type semiconductor layer 256 may include multiple layers having different compositions.

The active layer 255 may have a multiple quantum well MQW structure in which a quantum well layer and a quantum wall layer are alternately layered. In an example embodiment, the quantum well layer and the quantum wall layer may be $In_xAl_yGa_{1-x-y}N$ (0≤x≤1, 0≤y≤1, 0≤x+y≤1), and may have different compositions. In an example embodiment, the quantum well layer may be $In_xGa_{1-x}N$ (0<x≤1), and the quantum wall layer may be GaN or AlGaN. Thicknesses of the quantum well layer and the quantum wall layer may be within a range of 1 nm to 50 nm. In another example embodiment, the active layer 255 may have a single quantum well structure.

The first and second electrodes 259a and 259b may be disposed on a mesa-etched region of the first conductivity-type semiconductor layer 254 and the second conductivity-type semiconductor layer 256. The first electrode 259a may include elements such as Ag, Ni, Al, Cr, Rh, Pd, Ir, Ru, Mg, Zn, Pt, Au, and the like. The first electrode 259a may have a single layer or two or more layers. In an example embodiment, the second electrode 259b may be configured as a transparent electrode formed of a transparent conductive oxide or a transparent conductive nitride, and may include graphene. The second electrode 259b may include one or more of Al, Au, Cr, Ni, Ti, or Sn.

FIG. 5B is a side cross-sectional view illustrating an example of another type of LED chip, according to an example embodiment.

Referring to FIG. 5B, an LED chip 250B includes a substrate 251 and a semiconductor laminate S disposed on the substrate 251, similar to the previous example embodiment. The semiconductor laminate S may include a buffer layer 252, a first conductivity-type semiconductor layer 254, an active layer 255, and a second conductivity-type semiconductor layer 256.

The LED chip 250B includes a first electrode structure E1 and a second electrode structure E2, which are connected to the first and second conductivity-type semiconductor layers 254 and 256, respectively.

The first electrode structure E1 may include a connection electrode 258a, such as a conductive via, that penetrates through the second conductivity-type semiconductor layer 256 and the active layer 255 to be connected to the first conductivity-type semiconductor layer 254. The first electrode structure E1 may include a first electrode pad 259a' connected to the connection electrode 258a. The connection electrode 258a may be surrounded by an insulating portion 257 to be electrically separated from the active layer 255 and the second conductivity-type semiconductor layer 256. The connection electrode 258a may be disposed in a region in which the semiconductor laminate S is etched. The number, shape, and pitch of the connection electrode 258a, or the contact area with the first conductivity-type semiconductor layer 254 may be appropriately selected so that contact resistance is reduced. In an example embodiment, a plurality of the connection electrodes 258a may be arranged to form rows and columns on the semiconductor laminate S in order to improve a current flow.

The second electrode structure E2 may include an ohmic contact layer 258b and a second electrode pad 259b' on the second conductivity-type semiconductor layer 256.

The connection electrode 258a and the ohmic contact layer 258b may include a single layer or a multilayer structure, and may include, for example, materials of the first and second conductivity-type semiconductor layers 254 and 256, respectively, along with a conductive material having ohmic characteristics such as such as Ag, Al, Ni, Cr, or a transparent conductive oxide (TCO).

The first and second electrode pads 259a' and 259b' may be connected to the connection electrode 258a and the ohmic contact layers 258b, respectively, and may function as external terminals of the LED chip 250B. In an example embodiment, the first and second electrode pads 259a' and 259b' may be Au, Ag, Al, Ti, W, Cu, Sn, Ni, Pt, Cr, NiSn, TiW, AuSn, or a eutectic metal thereof. The first and second electrode structures E1 and E2 may be disposed in the same directions, for example, at a same side of the LED chip 250B.

Figure 6:
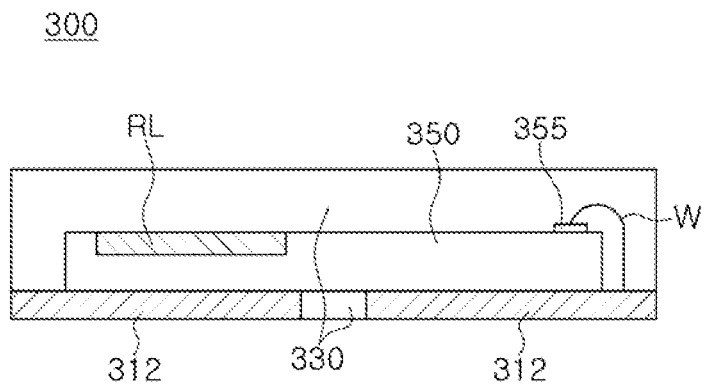
FIG. 6 is a side cross-sectional view of an optical sensor for in a flash LED package according to an example embodiment.

FIG. 6 is a side cross-sectional view of an optical sensor for a flash LED package, according to an example embodiment.

Referring to FIG. 6, an optical sensor 300 according to the present example embodiment may include a lead frame 312, an optical sensor chip 350 disposed on the lead frame 312, and a transparent resin layer 330 disposed on the lead frame 312 and encapsulating the optical sensor chip 350. The optical sensor chip 350 may include a plurality of terminals 355, and the plurality of terminals 355 may each be connected to the lead frame 312 by wires W. The optical sensor chip 350 may include a light receiving region RL disposed on an upper surface adjacent to one edge and a peripheral circuit region disposed in another region of the upper surface thereof. The light receiving region RL may include a photodiode array. Peripheral circuit regions other than the light receiving region RL may include circuit elements such as a transistor.

In an example embodiment, a control unit for controlling the flash LED package 100 may be disposed in the peripheral circuit region of the optical sensor 300.

Figure 7:
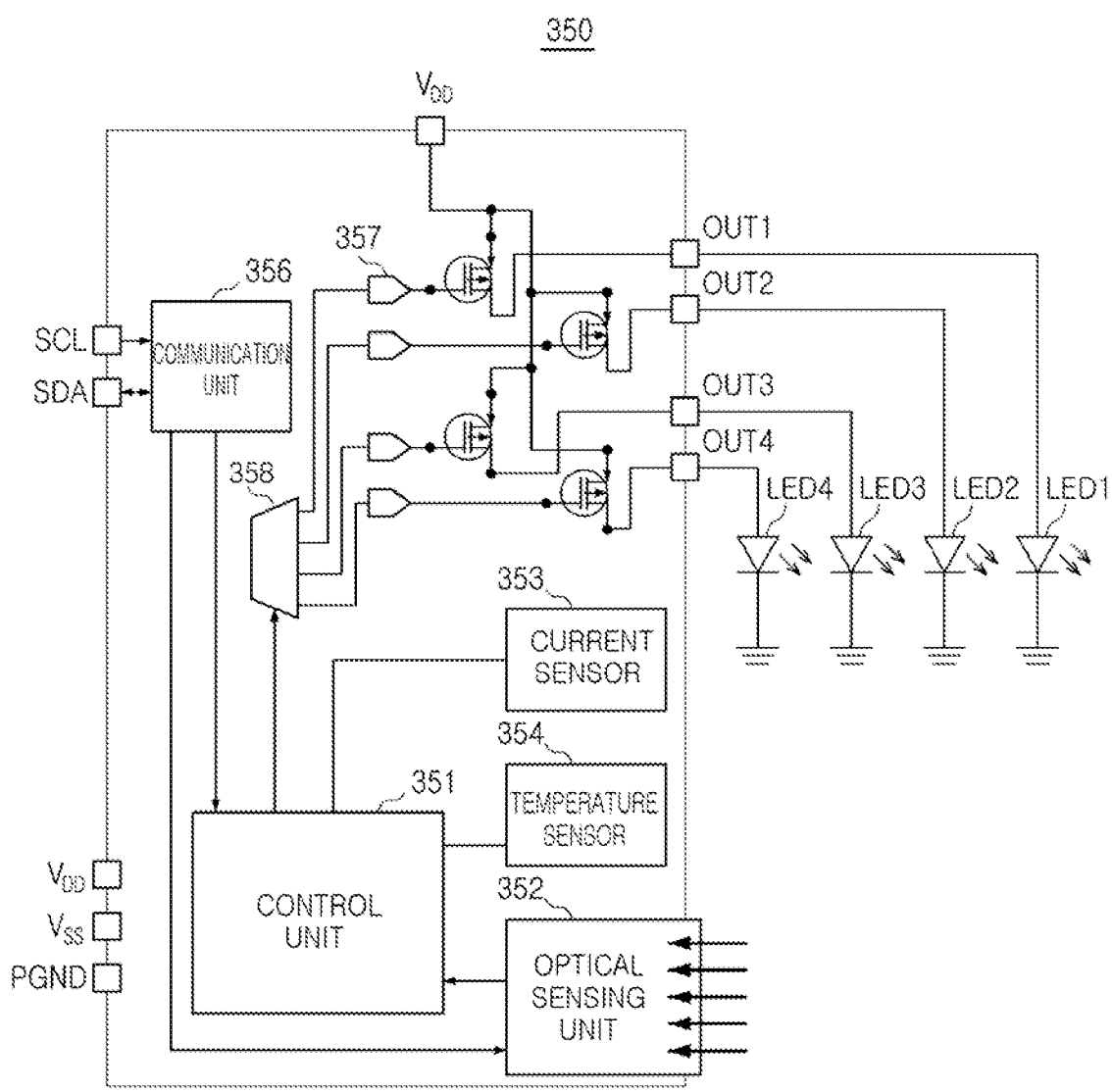
FIG. 7 is a block diagram of an optical sensor according to an example embodiment

FIG. 7 is a block diagram of an optical sensor, illustrating a case in which the control unit is included.

Referring to FIG. 7, the optical sensor 300 may detect light in a visible light band and detect a CCT value through an optical sensing unit 352 disposed in the light receiving region RL. The optical sensing unit 352 may transmit the detected CCT value to a control unit 351.

The control unit 351 may have a memory region in which a look-up table is stored. In another example embodiment, the look-up table may be stored in a separate memory separate from the control unit. The look-up table may include a driving power value corresponding to the detected CCT value. Therefore, an operation of the first to fourth LED light sources LED1 to LED4 may be controlled, respectively, according to the CCT value detected by the optical sensing unit 352. The driving power value may be at least one of a current value, a voltage value, and a pulse width for driving the first to fourth LED light sources LED1 to LED4, respectively.

In an example embodiment, the control unit 351 may control a driving voltage VDD supplied to first to fourth output ports OUT1 to OUT4 connected to the first to fourth LED light sources LED1 to LED4 through a demultiplexer 358 and a digital-analog converter 357, respectively.

A current sensor 353 and a temperature sensor 354 may detect a current supplied to the optical sensor 300 and the temperature of the optical sensor 300, respectively. In addition, a signal clock line SCL and a signal data line SDA may be input to the control unit 351 through a communication unit 356. VSS in FIG. 7 is a power source, and PGND is a ground path.

The flash LED package 100 of an example embodiment may include a first LED light source LED1 that emits white light, and second to fourth LED light sources LED2 to LED4 that emit blue light, green light, and red light, respectively, such that the flash LED package 100 may emit light of various colors over a very wide color temperature range.

In general, in order to control the color temperature of light, two white LED light sources having different color temperatures might be used. However, even if a white LED light source having a high color rendering index (CRI) of 90 were used, the range in which the color temperature could be changed would not be large, and the light emitted would not include other colors of light.

In contrast, according to an example embodiment, a LED light source that emits blue light, and red light and green light performing wavelength conversion of blue light, in addition to the white LED light source, is employed. This further extends a range of changes in color temperatures of emitted light to be more than just white light, and thus a broader range of color temperatures may be emitted compared to when the color temperature is changed using two white LED light sources having different color temperatures. This will now be further described with reference to experimental data.

In the following, a CCT change range of a first Example and a Comparative Example is compared, with reference to FIGS. 8 to 12.

Figure 9:
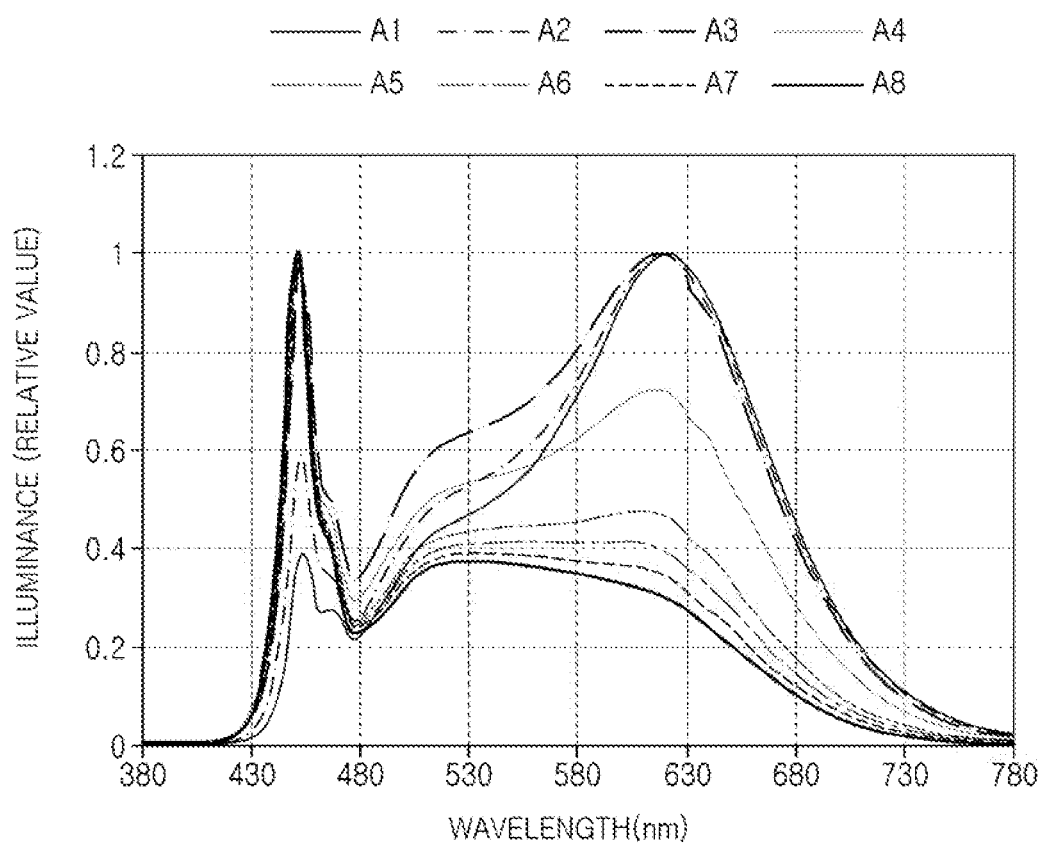
FIGS. 9 and 10 are views illustrating a spectrum and color coordinates of light emitted in a comparative example.
Figure 10:
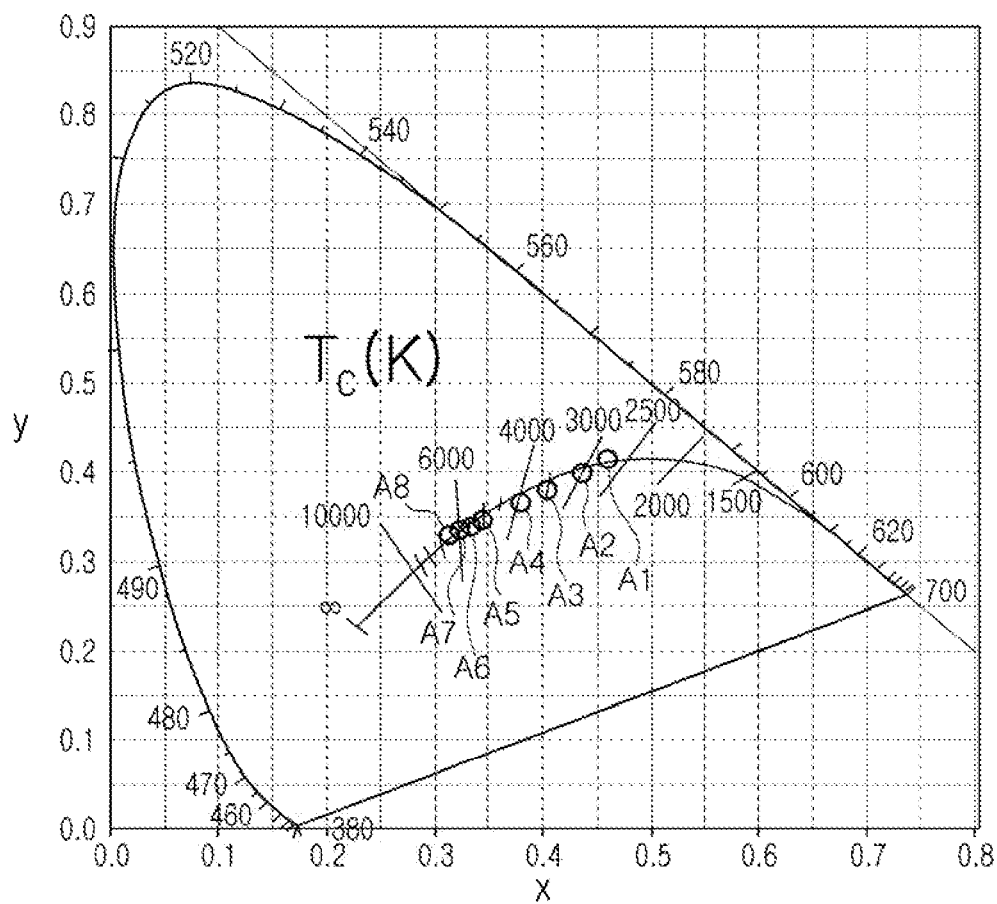

FIGS. 9 and 10 are views illustrating a spectrum and color coordinates of light emitted in a Comparative Example.

The Comparative Example represents a case of employing one warm-white light source along with one cool-white light source. In detail, the Comparative Example used a combination of a white LED light source (CRI90-2700) having a color temperature of 2700K and a color rendering index (CRI) of 90, along with a white LED light source (CRI90-6500) having a color temperature of 6500K and a CRI of 90.

In the Comparative Example, by changing a current value applied to each white LED light source, and measuring the CRI and CCT of the light emitted in respective cases A1 to A8, measurement values as shown in Table 1, below, were obtained.

As a result of repeating the measurement while changing the current value applied to each white LED light source, the CCT was measured to fluctuate in a range of 2760K~6535K. The spectrum of the measured wavelengths is shown in FIG. 9, and a distribution diagram as shown in FIG. 10 was obtained by displaying the data in color coordinates.

Referring to FIGS. 9 and 10, it can be seen that the CCT of the Comparative Example fluctuates within a radiation trajectory of a black body.

TABLE 1

|  | A1 | A2 | A3 | A4 | A5 | A6 | A7 | A8 |
|---|---|---|---|---|---|---|---|---|
| CRI90-2700 | 100 | 100 | 100 | 100 | 45 | 27 | 13 | 3 |
| CRI90-6500 | 0 | 12 | 41 | 80 | 100 | 100 | 100 | 100 |
| CRI (Ra) | 93.5 | 94.3 | 95.2 | 95.5 | 94.3 | 93.5 | 92.4 | 91.0 |
| CCT | 2760 | 3005 | 3506 | 4020 | 5038 | 5515 | 6036 | 6535 |

Figure 11:
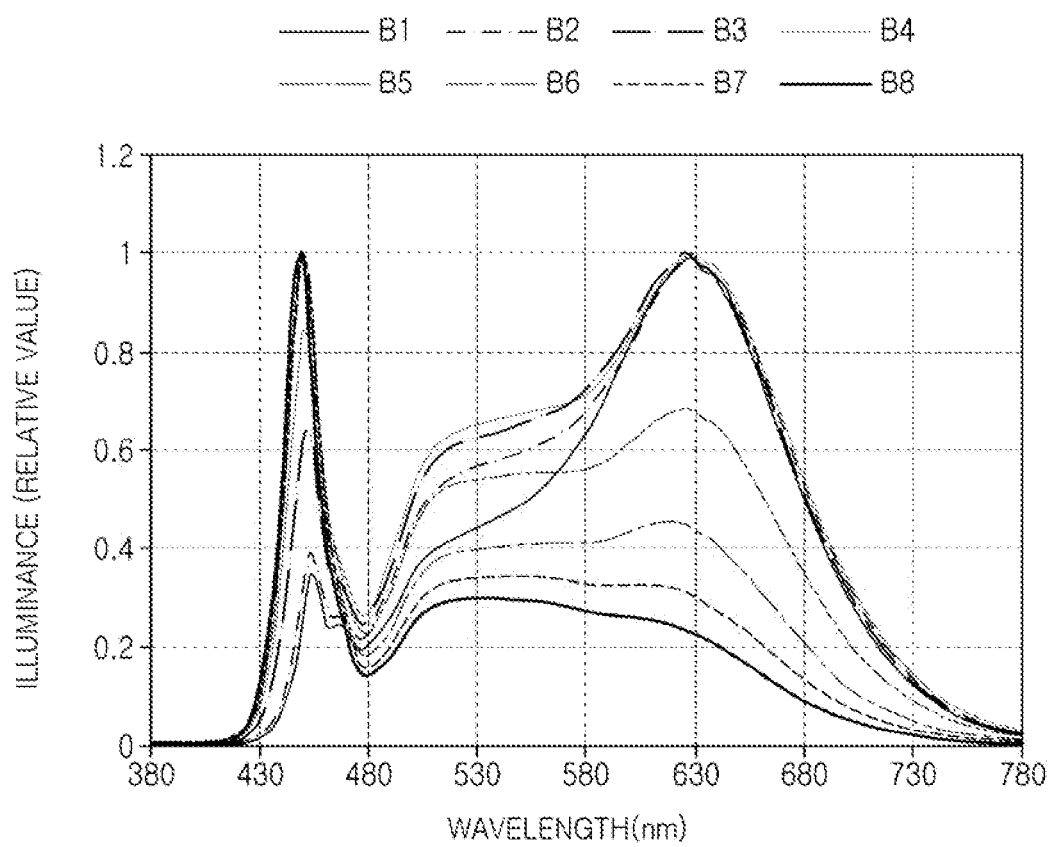
FIGS. 11 and 12 are views illustrating a spectrum and color coordinates of light emitted from a flash LED package according to an example embodiment.
Figure 12:
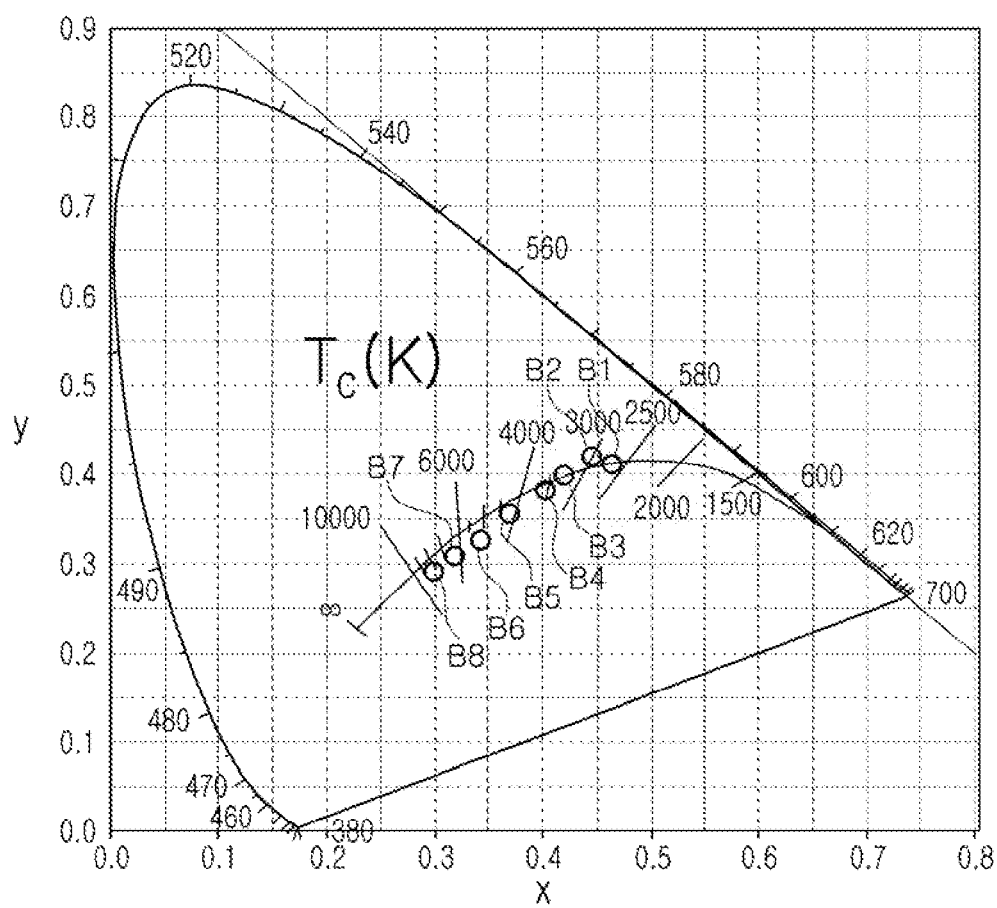

FIGS. 11 and 12 are views illustrating a spectrum and color coordinates of light emitted from the flash LED package according to a first Example.

The first Example represents a case of employing one warm-white light source along with an RGB LED light source. In detail, the first Example used a combination of a white LED light source (CRI90-2700) having a color temperature of 2700K and a CRI of 90, along with green, red, and blue LED light sources.

By changing a current value applied to each of the LED light sources, and measuring the CRI and CCT of light emitted in respective cases (B1 to B8), measured values as shown in Table 2, below, were obtained.

As a result of repeating the measurement while changing the current value applied to each of the LED light sources, the CCT was measured to fluctuate within a range of 2668K~8193K. The spectrum of the measured wavelengths is shown in FIG. 11. A result of displaying the data in a color coordinates is shown in a distribution diagram in FIG. 12. The CCT of the first Example fluctuates within a radiation trajectory of the blackbody, similar to the comparative example, but it can be seen that a variable range of the CCT is greatly increased in the first Example relative to the Comparative Example.

TABLE 2

|  | B1 | B2 | B3 | B4 | B5 | B6 | B7 | B8 |
|---|---|---|---|---|---|---|---|---|
| CRI90-2700 | 100 | 100 | 100 | 100 | 100 | 100 | 90 | 80 |
| Green | 5 | 25 | 30 | 40 | 50 | 50 | 60 | 70 |
| Red | 25 | 45 | 40 | 55 | 40 | 20 | 10 | 5 |
| Blue | 0 | 0 | 5 | 10 | 20 | 30 | 40 | 50 |
| CRI (Ra) | 95.2 | 96.9 | 98.0 | 96.5 | 96.2 | 93.6 | 92.5 | 91.0 |
| CCT | 2668 | 3034 | 3328 | 3529 | 4253 | 5126 | 6497 | 8193 |

The following second Example illustrates a case having a white LED light source (CRI80-2700) having a color temperature of 2700K and a CRI of 80, and having green, red, and blue LED light sources. That is, similar to the above-described first Example, in the second Example a single warm-white light source and an RGB LED light source were employed.

Figure 13:
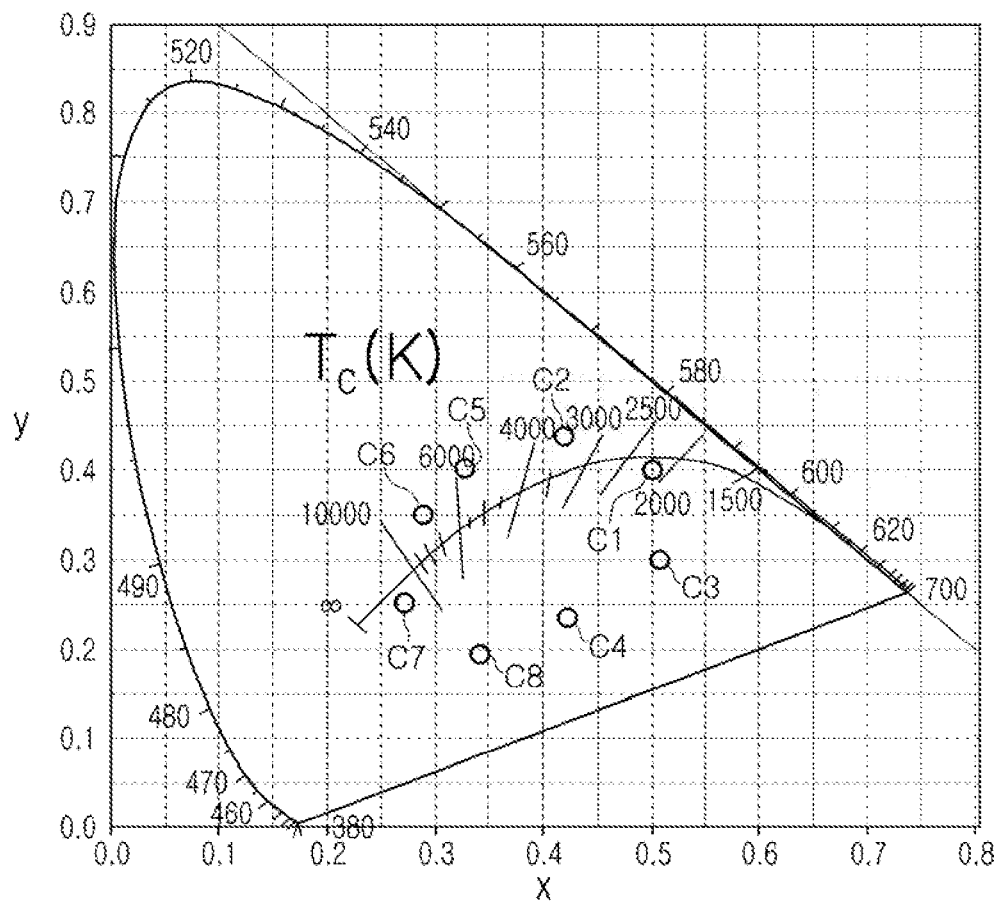
FIG. 13 is a view illustrating color coordinates of light emitted from a flash package according to an example embodiment.

By changing a current value applied to each of the LED light sources, and measuring the CRI and CCT of the light emitted in respective cases C1 to C8, measured values as shown in Table 3 were obtained. In the second Example, the CCT was measured to fluctuate within a range of 2152K to 16988K. The distribution diagram shown in FIG. 13 displays the spectrum of the measured wavelengths in the color coordinates. In the second Example, it was confirmed that the color was changed so that the CCT was changed in a wide range beyond the radiation trajectory of the black body. In addition, it can be seen that a variable range of CCT is significantly increased in the example, as compared to the Comparative Example.

Figure 8:
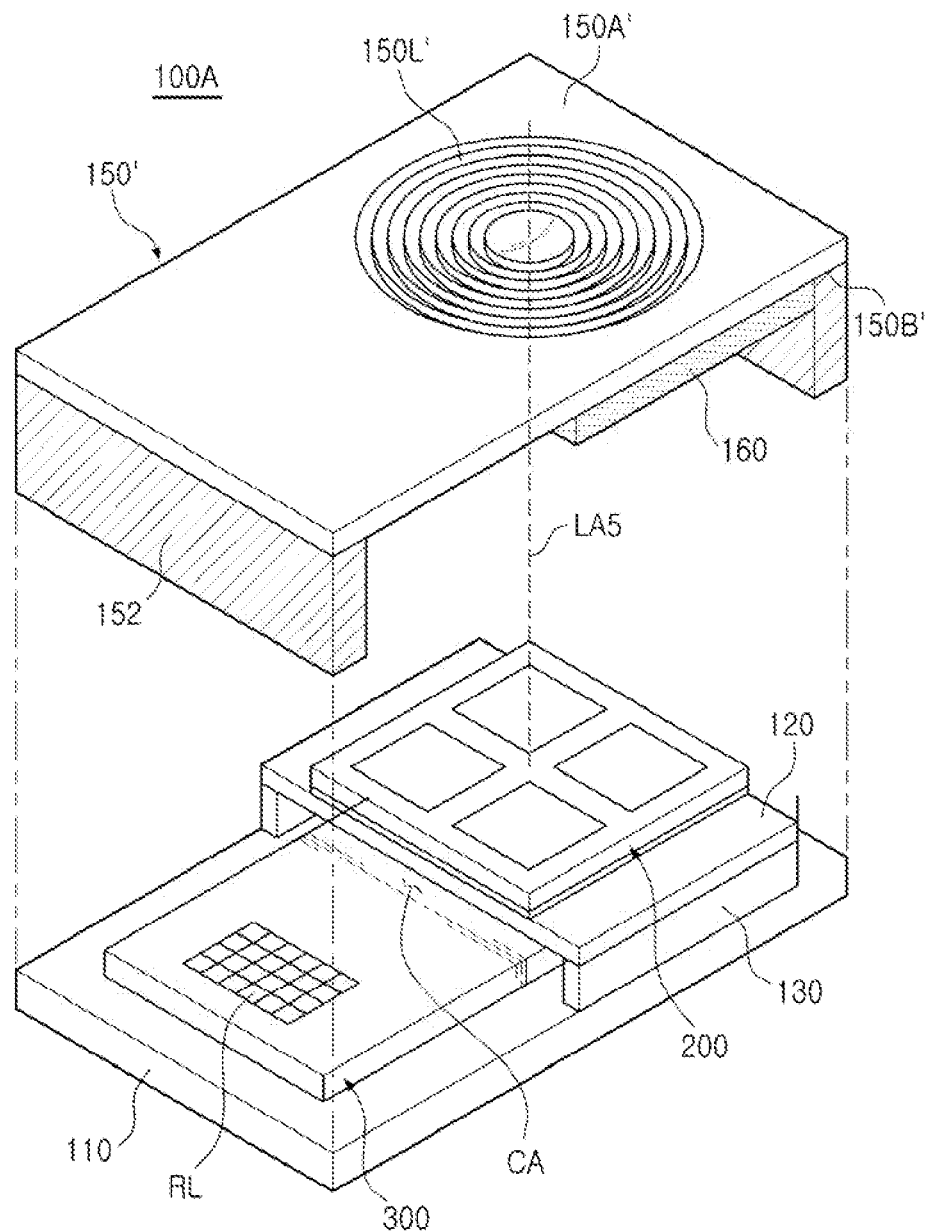
FIG. 8 is an exploded perspective view illustrating a flash LED package according to an example embodiment.

FIG. 8 is an exploded perspective view illustrating a flash LED package according to an example embodiment.

Referring to FIG. 8, a flash LED package 100A according to the present example embodiment can be understood to be similar the flash LED package 100 other than the structure illustrated in FIGS. 1 and 2 except for the position of the optical sensor 300 and the flash LED device 200, and the structure of the lens cover 150'. In addition, the components of the present example embodiment may be understood with reference to the description of the same or similar components of the flash LED package 100 shown in FIGS. 1 and 2 unless otherwise specified.

In the present example embodiment, the optical sensor 300 is disposed adjacent to the flash LED device 200, similar to the previous example embodiment. The light receiving region RL may be disposed in a region adjacent to the flash LED device 200 on the upper surface of the optical sensor 300.

The flash LED device 200 may be disposed on an interposer 120. The interposer 120 may be supported on the substrate 110 by a sidewall structure 130 such as a pillar or a support wall. The optical sensor 300 may be disposed in a space CA provided below the interposer 120. The light receiving region RL of the optical sensor 300 may be disposed in a region not overlapping the flash LED device 200, so as to receive light that is incident through an upper surface 150A' of the lens cover 150'.

As described above, in the present example embodiment, due to the structure in which the flash LED device 200 and the optical sensor 300 are disposed vertically, the area of the flash LED package 100A may be reduced compared to the previous example embodiment.

In the present example embodiment, the lens cover 150' may have a lens unit 150L' in a region overlapping the flash LED device 200. The lens unit 150L' may be disposed to have an optical axis LA5 passing through the center of the flash LED device 200.

By way of summation and review, when imaging a subject, the subject may be imaged with a different color tone according to a correlated color temperature (CCT) of ambient light.

As set forth above, embodiments may provide a flash LED package capable of providing flash light having various color temperatures using LED light sources that emit white light, green light, and red light.

TABLE 3

|  | C1 | C2 | C3 | C4 | C5 | C6 | C7 | C8 |
|---|---|---|---|---|---|---|---|---|
| CRI80-2700 | 80 | 90 | 0 | 20 | 40 | 20 | 80 | 40 |
| Green | 5 | 90 | 7 | 0 | 100 | 100 | 100 | 0 |
| Red | 90 | 100 | 100 | 100 | 0 | 0 | 0 | 100 |
| Blue | 0 | 0 | 4 | 15 | 15 | 30 | 100 | 40 |
| CRI (Ra) | 92.4 | 89.9 | 61.0 | 54.8 | 71.7 | 71.0 | 86.0 | 42.7 |
| CCT | 2152 | 3611 | 1466 | 1668 | 5720 | 7604 | 16988 | 2615 |

Embodiments may provide a flash LED package having an integrated optical sensor for sensing ambient light and capable of providing flash light having various color temperatures according to the ambient light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flash LED package, comprising:
a substrate;
a flash LED device in a first region of an upper surface of the substrate, and including first to fourth LED light sources that emit white light, blue light, green light, and red light, respectively;
an optical sensor in a second region of the upper surface of the substrate, and having a light receiving region that detects a correlated color temperature; and
a lens cover on the substrate to cover the flash LED device and the optical sensor, and having a lens unit in a region overlapping the first to fourth LED light sources,
wherein the first to fourth LED light sources have three or more different areas, and
wherein the first LED light source emits white light having a color temperature of 2000K to 5500K and a color rendering index of 80 or higher.

2. The flash LED package as claimed in claim 1, wherein the first to four LED light sources include first to fourth LED chips that emit blue light, respectively, and first to fourth wavelength conversion films respectively covering the first to fourth LED chips.

3. The flash LED package as claimed in claim 2, wherein:
the first wavelength conversion film includes a wavelength conversion material converting the blue light into yellow light, or a plurality of wavelength conversion materials converting the blue light into red light and green light,
the third wavelength conversion film includes a wavelength conversion material converting the blue light into green light, and
the fourth wavelength conversion film includes a wavelength conversion material converting the blue light into red light.

4. The flash LED package as claimed in claim 1, wherein the first to fourth LED light sources are arranged in a 2*2 matrix form, when viewed from above the substrate.

5. The flash LED package as claimed in claim 1, wherein an area of the first LED light source is greater than an area of any of the second to fourth LED light sources.

6. The flash LED package as claimed in claim 1, wherein the lens unit includes four Fresnel lenses having optical axes respectively passing through centers of each of the first to fourth LED light sources.

7. The flash LED package as claimed in claim 1, wherein the lens unit includes one Fresnel lens having an optical axis passing through a center of the flash LED device.

8. The flash LED package as claimed in claim 1, wherein the lens cover includes a sidewall structure mounted on the substrate and supporting the lens cover.

9. The flash LED package as claimed in claim 8, further comprising a diffusion sheet between the flash LED device and the lens cover and diffusing light emitted from the first to fourth LED light sources.

10. A flash LED package, comprising:
a substrate;
a flash LED device on an upper surface of the substrate, the flash LED device including first to fourth LED light sources that emit white light, blue light, green light, and red light, respectively, and having side surfaces surrounded by a reflective structure; and
a lens cover on the substrate, the lens cover having an upper surface having a lens unit in a region overlapping the first to fourth LED light sources, and having a lower surface facing the flash LED device,
wherein the first to fourth LED light sources have three or more different areas, and
wherein the first LED light source emits white light having a color temperature of 2000K to 5500K and a color rendering index of 80 or higher.

11. The flash LED package as claimed in claim 10, wherein the first to fourth LED light sources include
a wiring substrate having first and second wiring electrodes,
first to fourth LED chips mounted on the wiring substrate, and having a first surface on which first and second electrodes, connected to each of the first and second wiring electrodes, are disposed, a second surface located opposite to the first surface, and a side surface located between the first and second surfaces, and
first to fourth wavelength conversion films respectively disposed on the second surface of the first to fourth LED chips,
wherein the reflective structure surrounds the side surfaces of the first to fourth LED chips and the first to fourth wavelength conversion films.

12. The flash LED package as claimed in claim 10, further comprising an optical sensor adjacent to the flash LED device on the upper surface of the substrate, and having a light receiving region that detects light that is incident from the lens unit,
wherein the flash LED device is on an upper portion of the optical sensor to overlap a region other than the light receiving region.

13. A flash LED package, comprising:
a substrate;
a flash LED device in a first region of an upper surface of the substrate, and including first to fourth LED light sources that emit white light, blue light, green light, and red light, respectively;
an optical sensor in a second region of the upper surface of the substrate, and having a light receiving region that detects a correlated color temperature of incident light;
a lens cover on the substrate to cover the flash LED device and the optical sensor, and having a lens unit in a region overlapping the first to fourth LED light sources; and
a control unit that applies a driving power value corresponding to a value of the correlated color temperature detected by the optical sensor to the first to fourth LED light sources with reference to a previously-stored look-up table to control the correlated color temperature of light emitted from the flash LED device,
wherein the first to fourth LED light sources have three or more different areas, and wherein the first LED light source emits white light having a color temperature of 2000K to 5500K and a color rendering index of 80 or higher.

14. The flash LED package as claimed in claim 13, wherein the optical sensor and the control unit are disposed in one body unit,
the optical sensor is a chip that includes a light receiving region and a peripheral circuit region, and
the control unit is disposed in the peripheral circuit region of the optical sensor.

15. The flash LED package as claimed in claim 14, wherein the flash LED device is disposed such that a region other than the light receiving region overlaps an upper portion of the body unit.

16. The flash LED package as claimed in claim 13, wherein:
the first to fourth LED light sources include first to fourth LED chips that emit blue light, respectively, and first to fourth wavelength conversion films covering the first to fourth LED chips, and
the first wavelength conversion film includes a wavelength conversion material converting the blue light into yellow light, or a plurality of wavelength conversion materials converting the blue light into red light and green light, the third wavelength conversion film includes a wavelength conversion material converting the blue light into green light, and the fourth wavelength conversion film includes a wavelength conversion material converting the blue light into red light.

* * * * *